United States Patent
Steigerwald et al.

[11] Patent Number: 6,031,746
[45] Date of Patent: Feb. 29, 2000

[54] SWITCHING AMPLIFIER FOR GENERATING CONTINUOUS ARBITRARY WAVEFORMS FOR MAGNETIC RESONANCE IMAGING COILS

[75] Inventors: Robert Louis Steigerwald, Burnt Hills, N.Y.; William Frederick Wirth, Johnson Creek, Wis.; Ljubisa Dragolijub Stevanovic, Clifton Park; John Norton Park, Rexford, both of N.Y.

[73] Assignee: General Electric Company, Schenectady, N.Y.

[21] Appl. No.: 09/148,559

[22] Filed: Sep. 4, 1998

[51] Int. Cl.[7] .................................................. H02M 7/00
[52] U.S. Cl. .......................................... 363/71; 323/225
[58] Field of Search ....................................... 323/217, 224, 323/225, 266; 363/17, 65, 132, 71

[56] References Cited

U.S. PATENT DOCUMENTS

| 4,864,479 | 9/1989 | Steigerwald et al. | 363/17 |
| 5,576,940 | 11/1996 | Steigerwald et al. | 363/17 |
| 5,663,647 | 9/1997 | Wirth et al. | 324/222 |

*Primary Examiner*—Y. J. Han
*Attorney, Agent, or Firm*—Jill M. Breedlove; Douglas E. Stoner

[57] ABSTRACT

A partial-voltage buck regulator controls a high-voltage bus to a full-bridge circuit such that overall switching losses are reduced and distributed. Low-voltage buck regulator devices are PWM-switched when high output voltage is needed, and high-voltage bridge devices are PWM-switched when low output voltage is needed. A variable input power supply, which may be operated in a high power factor mode, can adjust the input bus voltages to achieve optimum performance for a given magnetic resonance imaging sequence.

13 Claims, 8 Drawing Sheets

SWITCHING AMPLIFIER FOR GENERATING CONTINUOUS ARBITRARY WAVEFORMS FOR MAGNETIC RESONANCE IMAGING COILS

BACKGROUND OF THE INVENTION

The present invention relates generally to a switching amplifier useful for driving a gradient coil in a magnetic resonance imaging (MRI) system and, more particularly, to such an amplifier which is capable of continuous arbitrary waveform generation.

Gradient coils in MRI systems require high, rapidly changing current as well as precise current control. To achieve fast current changes, a high voltage drive is needed, requiring high-voltage, high-current semiconductors (typically insulated gate bipolar transistors, i.e., IGBT's). Higher voltage devices generally have higher switching losses, limiting the maximum switching frequency attainable. With high switching losses, the time interval permitted for the high-voltage inverter to switch at a sufficiently high frequency to maintain precise current waveforms is also limited. A solution has been to add linear amplifiers, which, unfortunately, add relatively high losses. For trapezoidal coil currents, the high-voltage inverter provides the high voltage needed to obtain fast current rise and fall times; and during the flat top portion of the wave which does not require high voltage, a linear amplifier controls the current.

Unfortunately, using linear amplifiers as described hereinabove is not practicable for arbitrary current waveforms (i.e., that are not trapezoidal) because the losses are too great to allow such waveforms to be maintained for a sufficient time to permit high-performance imaging. Hence, it is desirable to provide a switching amplifier which reduces and distributes device switching losses such that arbitrary waveforms can be maintained for extended periods of time, thereby enabling high-performance advanced imaging.

SUMMARY OF THE INVENTION

A switching amplifier for generating arbitrary gradient coil waveforms comprises a high-frequency, reduced-voltage buck regulator, including relatively low-voltage and fast-switching devices, which controls a high-voltage bus feeding a high-voltage, full-bridge inverter. When high voltage is needed, the reduced-voltage buck circuit performs the switching function to control the coil current. And when low voltage is needed, the high-voltage bridge inverter performs the switching function, but with a low-voltage dc bus applied to its input. In this manner, switching losses are shared by the buck regulator and bridge inverter and are minimized. As a result, high-frequency operation is achieved such that arbitrary coil waveforms can be generated, allowing for advanced imaging techniques such as those employing spiral trajectories. Additionally, further optimization and ripple current reduction in the gradient coil are achieved by controlling a variable input power supply to adjust the input bus voltages.

DETAILED DESCRIPTION OF THE INVENTION

Figure 1:
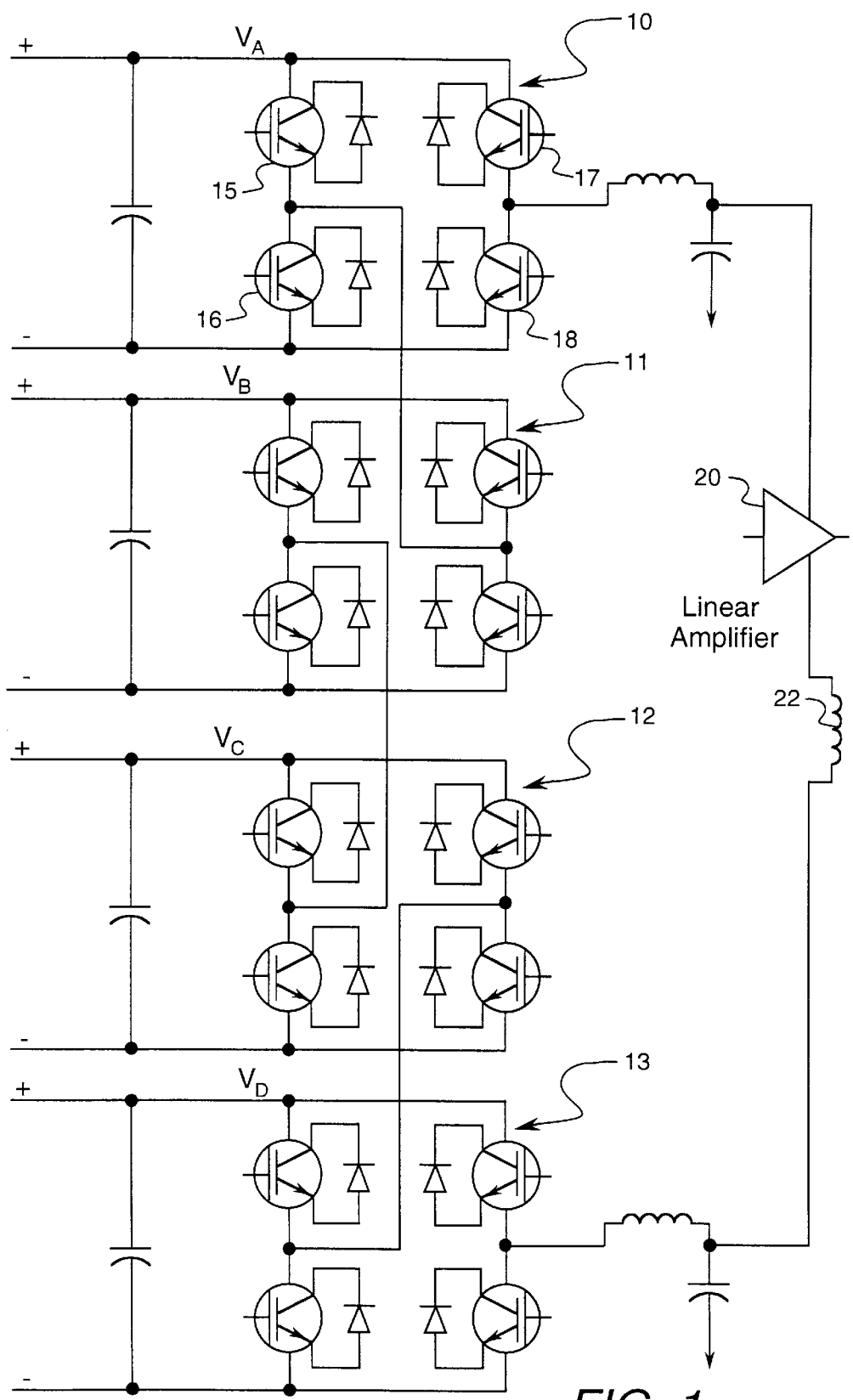
FIG. 1 schematically illustrates four stacked full-bridge amplifiers for obtaining high voltage and a relatively high switching frequency.

FIG. 1 shows one conventional switching amplifier system for obtaining high voltage and a relatively high switching frequency suitable for driving a gradient coil in an MRI system. As shown, four full-bridge class-D switching amplifiers 10–13, each comprising four switching devices 15–18, are stacked in series with a linear amplifier 20 driving a gradient coil 22 in an MRI system. In a typical case, the dc buses feeding the amplifier may be on the order of 400 volts dc which gives a total high voltage drive of 1600 volts. In switching, each bridge is phase-shifted by 45 degrees with respect to the adjacent bridge, effectively multiplying the individual bridge switching frequency by a factor of eight. For example, if each bridge switches at 31.25 kHz, there is an effective coil ripple frequency of 250 kHz. The bridge controls the high-slew-rate current transitions, and the series-connected linear amplifier controls the current during low-slew-rate portions of the gradient current waveform.

Figure 2:
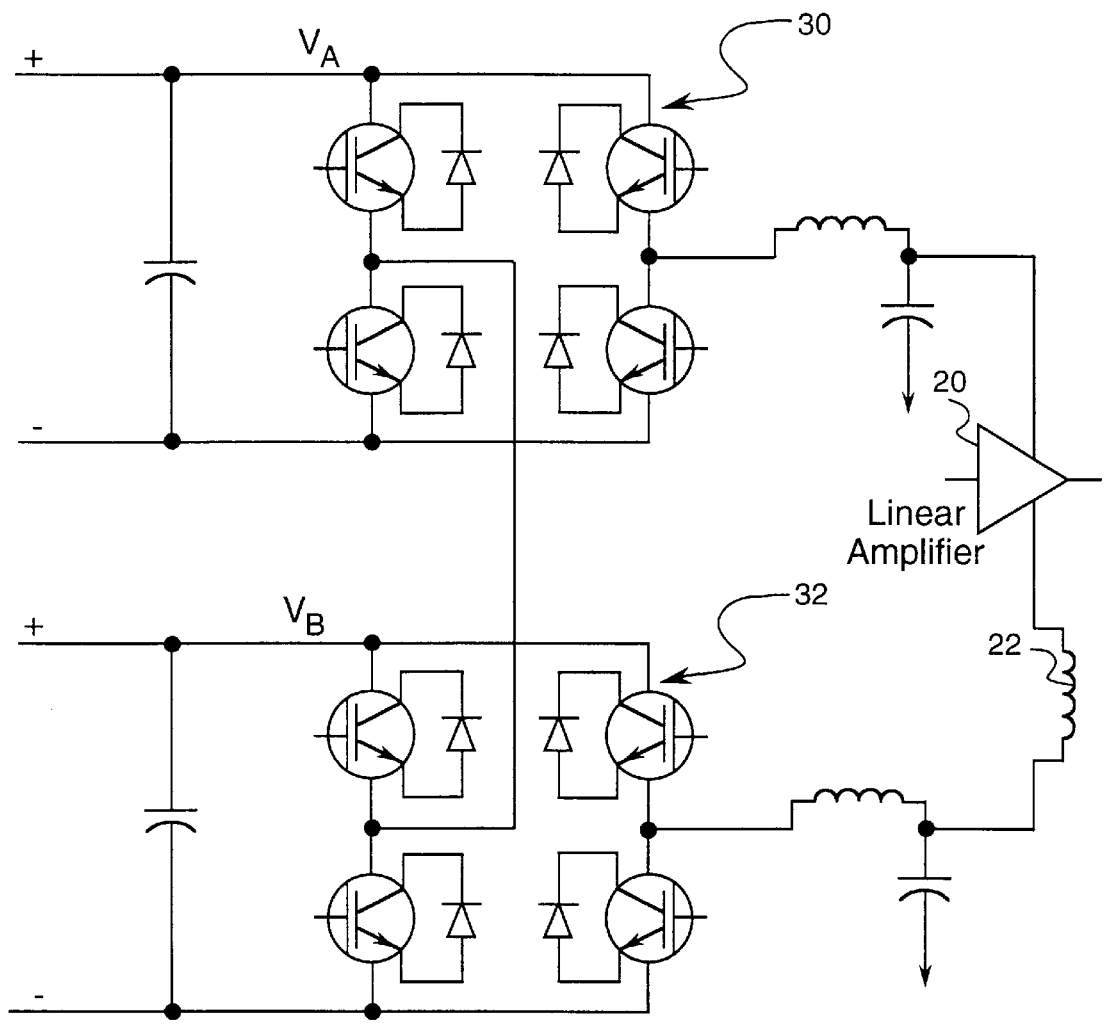
FIG. 2 schematically illustrates a system similar to that of FIG. 1 but which utilizes higher voltage IGBT's.

FIG. 2 shows a system similar to that of FIG. 1 but which takes advantage of newer, higher voltage IGBT's, and thus requires only two class-D bridge amplifiers 30 and 32 in series. The attainable slew rate for the system of FIG. 2 is one-half that of FIG. 1, assuming the same type devices are used, but this has been found sufficient for most MRI applications since higher slew rates can lead to undesirable patient nerve stimulation. As a result, the lower cost system of FIG. 2 has become generally used for imaging sequences employing trapezoidal gradient current waveforms. The systems of FIG. 1 and FIG. 2 can generate some arbitrary current waveforms, but cannot practicably maintain such waveforms for long periods of time due to high switching losses and an attendant semiconductor device temperature rise.

Figure 3:
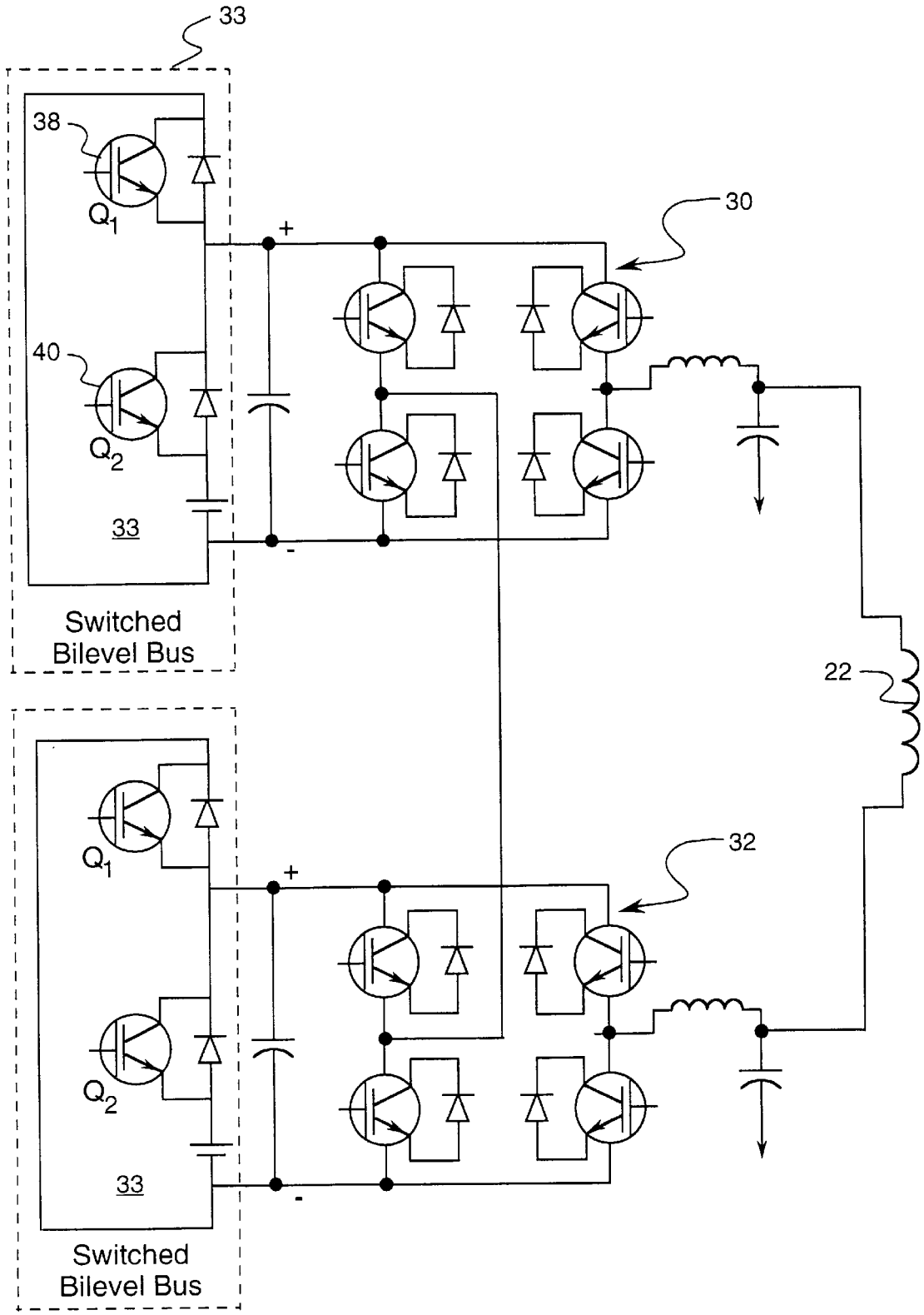
FIG. 3 schematically illustrates a gradient amplifier switched bilevel bus circuit.

FIG. 3 shows a system which lowers the dc bus voltage in a single step for use during the flat top portion of a trapezoidal waveform, i.e., where high voltage is not needed. The system of FIG. 3 includes a switched bilevel bus circuit 33 at the input of each full-bridge amplifier 30 and 32. Each switched bilevel bus 33 includes a half-bridge connection of switching devices 38 and 40. When low voltage is required from the amplifier, device 38 is turned off and device 40 is turned on. Bridge switching losses are reduced because these losses are approximately proportional to the dc bus voltage provided thereto. The amplifier of FIG. 3 is described in U.S. Pat. No. 5,663,647 and is commonly referred to as a Gradient Amplifier Switched Bilevel Bus. With such a system, the linear amplifier which adds high losses may be eliminated, and precise current control may be maintained during the flat top portions of trapezoidal current waveforms. However, this system is optimized only for trapezoidal waveforms. For arbitrary waveforms, such as sine waves used in more advanced spiral imaging techniques, the high-voltage bus must remain connected for most of the waveform, resulting in high switching losses. Hence, an arbitrary waveform cannot be maintained for long due to excessive IGBT switching losses.

Figure 4:
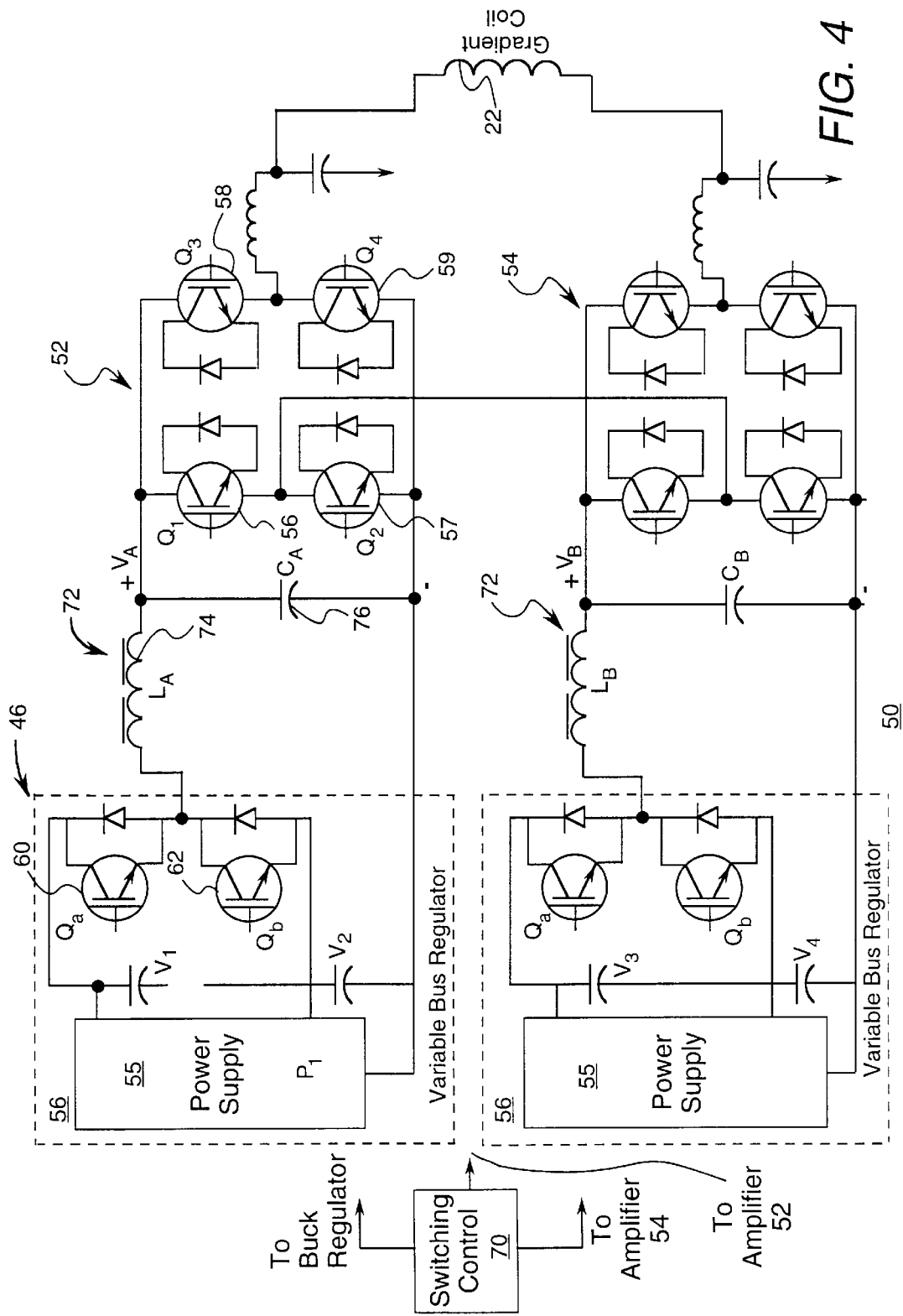
FIG. 4 schematically illustrates a gradient amplifier, switched variable bus circuit in accordance with preferred embodiments of the present invention.

FIG. 4 illustrates a switching amplifier 50 for generating arbitrary gradient coil waveforms in accordance with preferred embodiments of the present invention. In the embodiment of FIG. 4, two full-bridge class-D switching amplifiers 52 and 54 are connected in series. Switching amplifiers 52 and 54 each comprise switching devices 56–59. Power is supplied to the switching amplifiers via isolated dc bus voltages $V_A$ and $V_B$, which can range, for example, up to 750 volts dc. The isolated dc bus voltages are each supplied by a bi-directional buck converter 46. Each buck converter obtains its dc bus voltage $V_1$ from a line-interface power supply 55 ($P_1$). Each power supply and buck converter combination comprises a variable bus regulator 66. Switching device control is represented in FIG. 4 by a block 70. A filter 72 at the output of the buck regulator comprises inductance 74 and capacitance 76 for smoothing current.

The switching devices (60, 62) in the buck regulator need only be rated for the dc bus voltage $V_1$ (e.g., on the order of 400–500 Vdc), as opposed to the entire bus voltage $V_1+V_2$ (e.g., on the order of 800 Vdc). As a result, lower voltage switching devices may be used in the buck regulator. In effect, the 750 Vdc bus is controlled by a buck regulator with only a 400 Vdc rating, which thus is referred to herein as a "partial-voltage" buck regulator. The switching losses of 600 volt IGBT's that can be used in the buck regulator, for example, are typically one-third those of 1200 volt IGBT's that are used in the full-bridge switching amplifier, for example, if the same type devices are used. Additionally, new higher-speed 600 volt IGBT's (devices 60 and 62) reduce the switching losses to one-eighth of the older higher voltage devices. The present invention takes advantage of the significantly lower switching losses of lower voltage switching devices in the reduced-voltage buck regulator, as explained hereinafter.

In accordance with preferred embodiments of the present invention, the dc bus voltages $V_A$ and $V_B$ are varied rapidly between $V_2$ and $V_1+V_2$ by suitably controlling the partial-voltage buck regulator by control 70. Most of the pulse width modulation (PWM) switching is performed using the lower voltage buck regulator devices. For example, if voltage levels between 400 and 750 volts are required by the coil, the voltage is regulated using buck regulator switching devices 60 and 62 that switch a dc bus of 400 Vdc, not 750 Vdc as would be the case if the full-bridge amplifiers were performing the switching function. For this higher-voltage output requirement, the control 70 causes the output bridges to be switched simply to give the proper polarity voltage to the coil and therefore incur negligible switching losses. Since the voltage $V_A$ (and $V_B$) cannot be reduced below $V_2$ (e.g., 400 V), the output bridges begin switching in PWM fashion when these lower output voltages are needed. During this time, the input buck regulator is not switching, and is thus not producing any switching losses, but the output bridges are switching with a reduced dc bus voltage (e.g., $V_2$=400 Vdc). Since switching losses are approximately proportional to the dc bus voltage, the switching losses of the output bridge at the reduced bus voltage are significantly lower. By controlling the overall amplifier in this manner, switching losses are reduced and distributed over several devices.

For example, in the embodiment of FIG. 4 with a typical gradient coil inductance around 1 mH, a rate of change of gradient coil current (di/dt) of 1500 A/msec can be obtained. For a typical coil gain of 85 A/Gauss/cm, a resulting gradient field slew rate (i.e., di/dt divided by coil gain) is approximately 176 Tesla/m/sec. A typical maximum slew rate of 120 Tesla/m/sec is sufficient such that the 750 Vdc bus provides margin to overcome gradient coil inductance and resistance variations.

Figure 5:
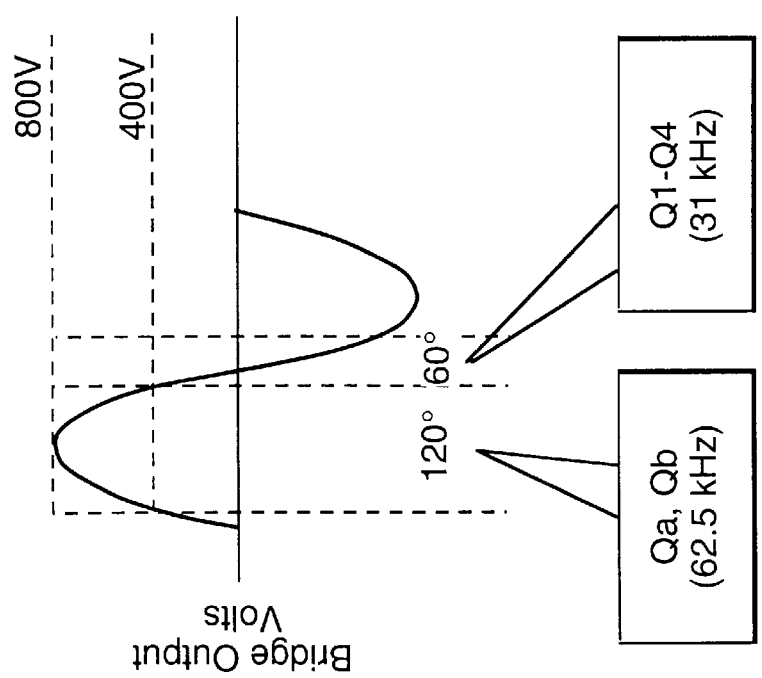
FIG. 5 graphically illustrates switching times for the buck regulator and bridge inverter of FIG. 4 for the case of a sine wave output with slew rates requiring relatively high amplifier output voltage.

FIG. 5 shows when the buck regulator and bridge of FIG. 4 would switch for the case of a sine wave output with slew rates requiring relatively high amplifier output voltage. Assuming that $V_1=V_2=400$ Vdc, devices 60 ($Q_a$) and 62 ($Q_b$) switch in PWM fashion when an output voltage above 400 V is needed while the output bridge simply selects the polarity to apply to the gradient coil; i.e., the output bridge is not PWM switching. When an output voltage below 400 V is needed, device $Q_b$ remains on most of the time to apply $V_2$ to the bridge input bus $V_A$, and the bridge devices switch in PWM fashion to regulate the output voltage. The lower voltage devices (60, 62) perform the switching function when high voltage is needed; and the high-voltage devices perform the switching when low output voltage is needed, but advantageously with a low applied bus voltage. Not only are the high-voltage devices switching with a low voltage applied bus, which advantageously results in low switching losses, but also the percentage of PWM switching time for the higher voltage devices is only about one-third, i.e., 60 out of 180° for the illustrated example.

Figure 6:
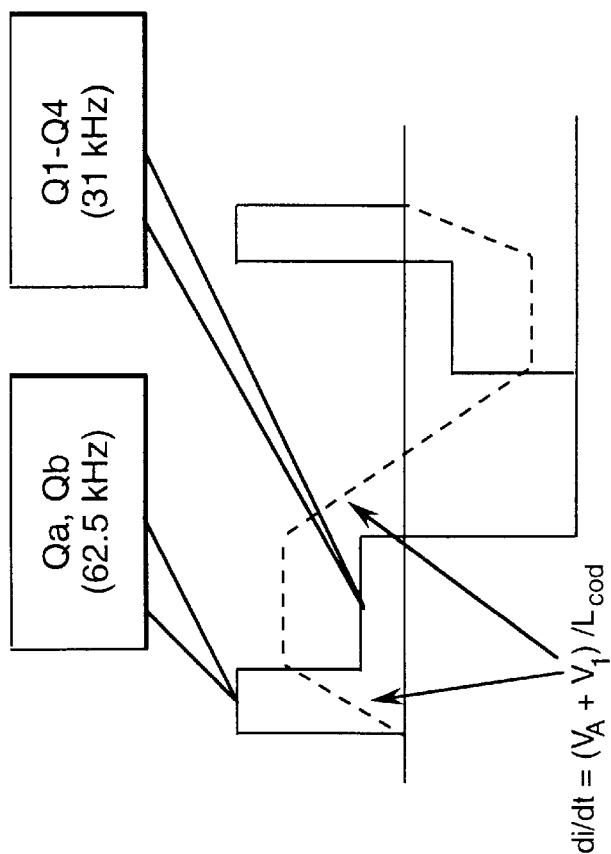
FIG. 6 graphically illustrates switching times for the buck regulator and bridge inverter for the case of a trapezoidal gradient current waveform.

FIG. 6 shows the case for a trapezoidal gradient current waveform. When a voltage greater than $V_2$ is needed, devices 60 ($Q_a$) and 62 ($Q_b$) perform the switching function, and when a voltage less than $V_2$ is needed, the bridge performs the switching function.

Further, voltage $V_2$ can be applied directly to the coil by leaving device Qb on (e.g., during the flat top portion of a trapezoidal waveform), in which case the coil current can be controlled directly such that no device switching is needed. This results in zero amplifier switching losses.

The voltages $V_1$ and $V_2$ are supplied from a line-interface power supply that can be controlled to be variable. Thus, for a given imaging sequence, $V_1$ and $V_2$, either in proportion or separately, can be varied to achieve the best possible performance.

An advantage of the arrangement of a switching amplifier according to the present invention is that relatively high switching frequencies can be obtained which can lead to low gradient coil ripple currents and precise current control. As a result, a linear amplifier, such as used in the circuits of FIGS. 1 and 2, is not needed.

Figure 7:
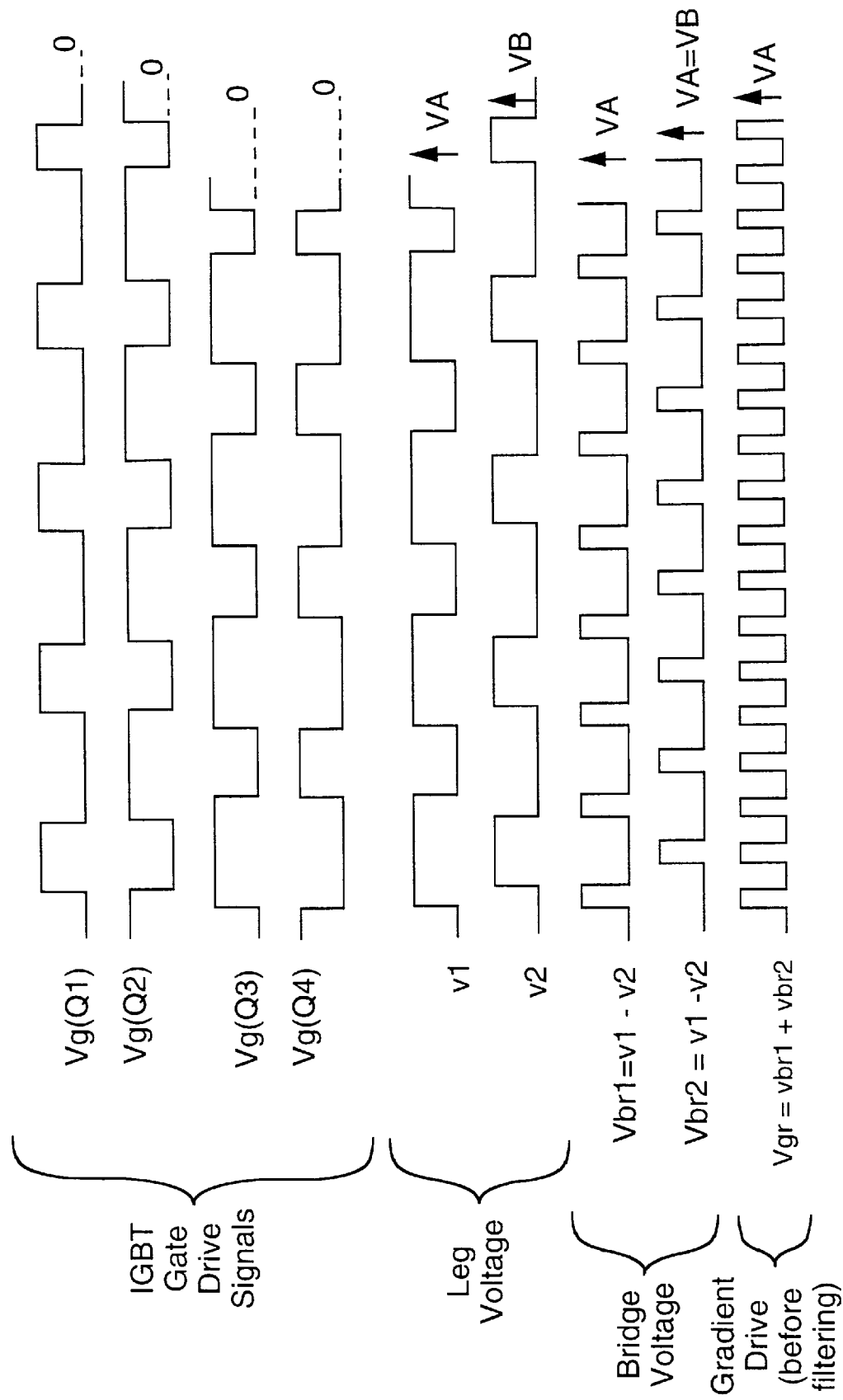
FIG. 7 graphically illustrates how the switching frequency of an inverter bridge leg is multiplied by a factor of four at the gradient coil in accordance with preferred embodiments of the present invention.

FIG. 7 shows how the switching frequency of a bridge leg (e.g., $Q_1$ and $Q_2$) is multiplied by a factor of four at the gradient coil. That is, the switching frequency is multiplied by two due to the full bridge and again by two due to a 180° phase shift between the two bridges. For example, if the bridge devices are switched at 31.25 kHz, then the equivalent output switching frequency is 125 kHz. This relatively high frequency in combination with high-frequency output LC filters results in a low ripple current being applied to the gradient coil. For trapezoidal currents, such as illustrated in FIG. 6, the voltage $V_2$ can be controlled to this precise value (to allow the bridges to operate at a 50% duty cycle) by adjusting the input power supply. In this case, very low output ripple results, theoretically zero. Output current ripple can also be effectively eliminated during flat top portion of the trapezoidal current waveform if the input power supply regulates voltage $V_2$ voltage to the value necessary to overcome conduction losses in the power converters and the gradient coil. This approach provides an added benefit of essentially eliminating switching losses in both buck regulators and output bridges since they are all continuously conducting during the flat top portion of the waveform.

The input supply 66 ($P_1$) can be a soft-switched supply of any suitable topology, such as a phase-shifted transition resonance bridge, such as described in U.S. Pat. No. 4,864,479 or, as an alternative, a series-resonant converter. Either of these exemplary soft-switched supplies, among others, would provide a fast response, low switching loss, high efficiency supply suitable for the applications described herein. In addition, these exemplary supplies can provide a high power factor to the input ac line, if desired.

The reduced-voltage buck regulator switching frequency is also multiplied by a factor of two if the two bridges are phase shifted 180° relative to each other, as described hereinabove. Since the devices in the buck regulator have lower switching losses than the output bridge devices, the buck regulator devices may operate at high frequencies. For example, if the buck regulators operate at 62.5 kHz, then an equivalent output switching frequency of 125 kHz results, just as in the output bridges.

Figure 8:
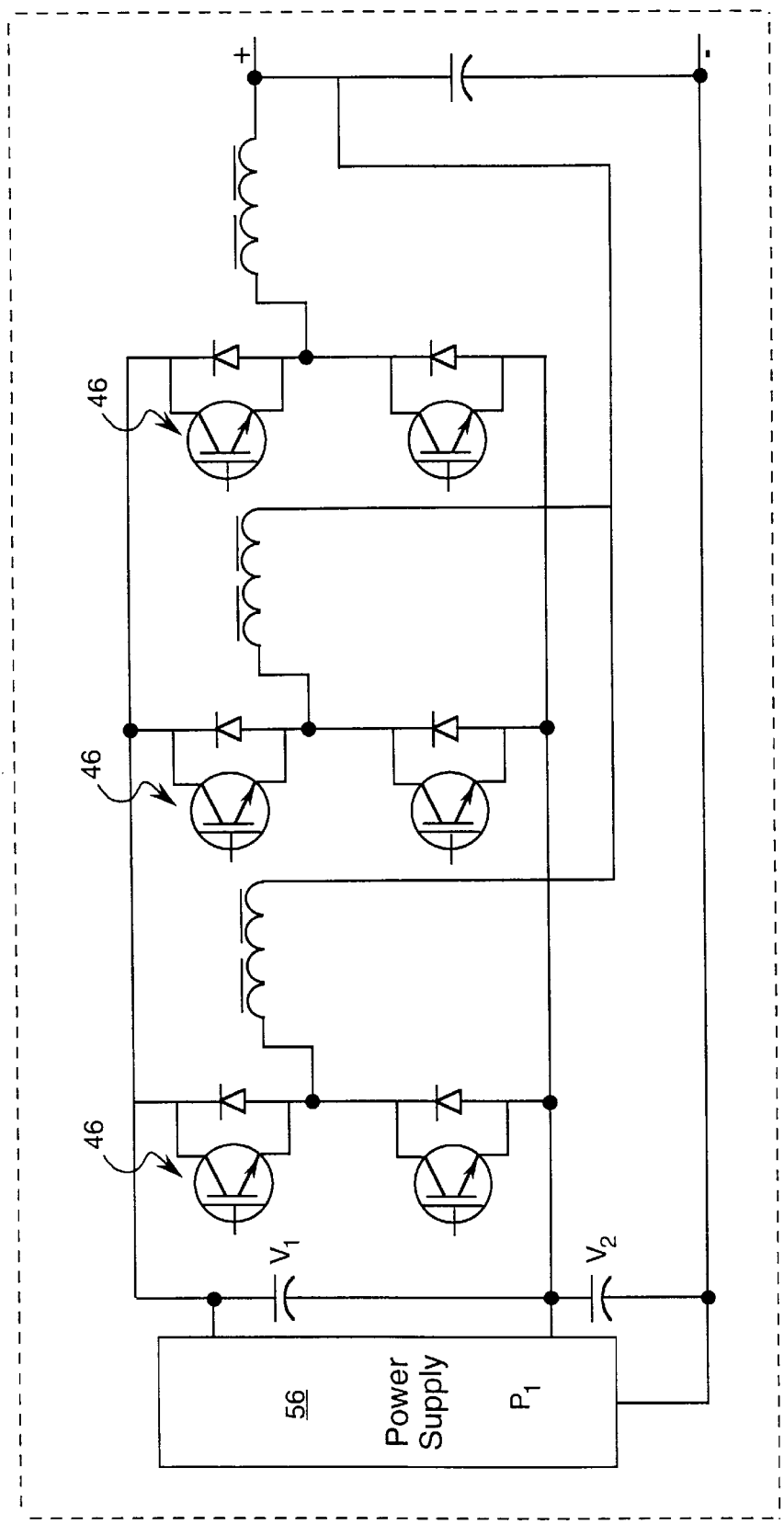
FIG. 8 schematically illustrates a polyphase partial-voltage buck regulator.

FIG. 8 illustrates that N buck regulators can be arranged in a polyphase connection in accordance with preferred embodiments of the present invention. Here, N switching regulators are operated 360/N degrees out of phase to achieve an equivalent switching frequency of N*f. And the switching frequency gets doubled again if the two buck regulators are phase shifted with respect to each other. The polyphase buck regulator, which comprises lower-power regulators coupled in parallel, represents an alternative to paralleling individual devices in a single module.

Figure 9:
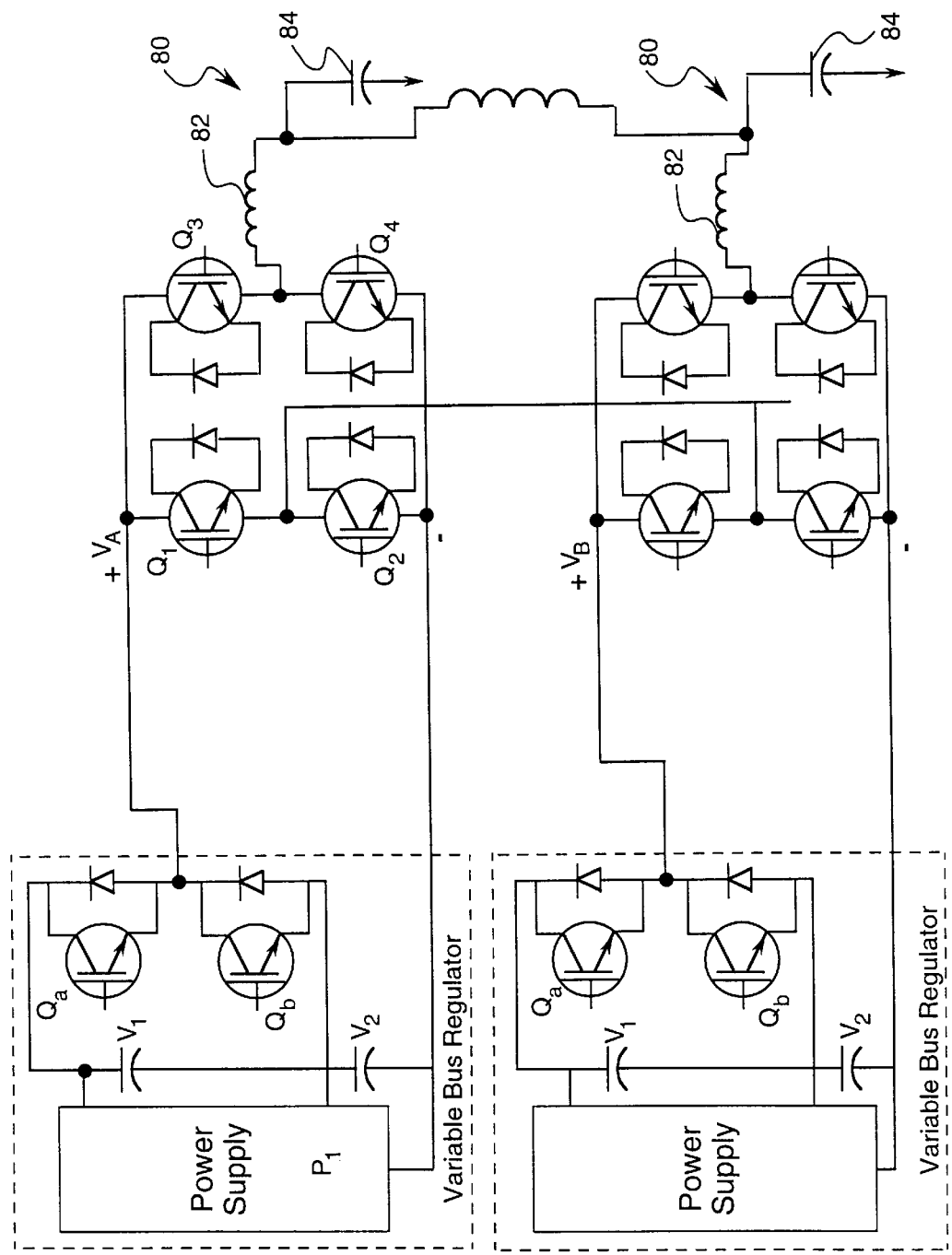
FIG. 9 schematically illustrates an alternative embodiment of a gradient amplifier, switched variable bus circuit of the present invention.

FIG. 9 illustrates an alternative embodiment of gradient amplifier, switched variable bus circuit. In particular, FIG. 9 differs from FIG. 4 in that the output filter 72 of each buck regulator is eliminated. Operation of the circuit of FIG. 9 is similar to that of FIG. 4 as described hereinabove with the function of filters 72 being performed by output filters 80, each comprising an inductance 82 and a capacitance 84, in combination with the gradient coil 22.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A switching amplifier, comprising:

at least two isolated dc output voltage buses;

an input buck regulator for controlling each dc output voltage bus, the input buck regulator coupled across a first input voltage bus and a second input voltage bus, the first input voltage bus being connected in series with the second input voltage bus, the first and second input voltage buses being adapted for coupling to an input power supply, the voltage on each dc output voltage bus being greater than the voltage on the second input voltage bus during normal running operation;

a bridge inverter coupled to each dc output voltage bus for providing a voltage to a load;

a switching control for controlling the input buck regulator to switch for load voltages above a threshold voltage and for controlling the bridge inverters to switch for load voltages below the threshold.

2. The switching amplifier of claim 1 wherein the isolated voltage buses comprise variable voltage buses.

3. The switching amplifier of claim 1 wherein the switching control controls the input buck regulator and the bridge inverters to switch in a PWM mode.

4. The switching amplifier of claim 1 wherein the buck regulators are coupled to receive power from a variable input power supply.

5. The switching amplifier of claim 4 wherein the variable input power supply comprises a high power factor supply.

6. The switching amplifier of claim 1 wherein the bridge inverters are phase-shifted with respect to each other.

7. The switching amplifier of claim 1 wherein the input buck regulators comprise polyphase buck regulators.

8. The switching amplifier of claim 1 wherein the input buck regulator comprises a partial-voltage buck regulator with a voltage rating equal to a portion of the voltage rating of the bridge inverters.

9. The switching amplifier of claim 1 wherein the bridge inverters have a duty cycle of approximately 50%.

10. The switching amplifier of claim 1 wherein the switching control controls the second voltage bus without switching devices in the buck regulator or bridge inverters in order to apply the voltage on the second voltage bus directly to the load.

11. The switching amplifier of claim 1, further comprising filter means for smoothing current provided to the load.

12. The switching amplifier of claim 11 wherein the filter means comprises an output filter coupled to each buck regulator.

13. The switching amplifier of claim 11 wherein the filter means comprises an output filter coupled to each bridge inverter.

* * * * *